United States Patent
Sawachi et al.

(10) Patent No.: US 8,872,350 B2
(45) Date of Patent: Oct. 28, 2014

(54) SEMICONDUCTOR DEVICE AND MANUFACTURING METHOD THEREOF

(75) Inventors: Shigenori Sawachi, Kawasaki (JP); Osamu Yamagata, Kawasaki (JP); Hiroshi Inoue, Kawasaki (JP); Satoru Itakura, Kawasaki (JP); Tomoshige Chikai, Kawasaki (JP); Masahiko Hori, Kawasaki (JP); Akio Katsumata, Kawasaki (JP)

(73) Assignee: J-Devices Corporation, Usuki-Shi, Oita (JP)

( * ) Notice: Subject to any disclaimer, the term of this patent is extended or adjusted under 35 U.S.C. 154(b) by 0 days.

(21) Appl. No.: 13/616,549

(22) Filed: Sep. 14, 2012

(65) Prior Publication Data

US 2013/0200523 A1    Aug. 8, 2013

(30) Foreign Application Priority Data

Feb. 8, 2012    (JP) .................................. 2012-25042

(51) Int. Cl.
*H01L 23/48* (2006.01)
*H01L 23/495* (2006.01)
*H01L 23/02* (2006.01)
*H01L 23/52* (2006.01)

(52) U.S. Cl.
USPC ............ 257/774; 257/678; 257/686; 257/777

(58) Field of Classification Search
CPC ........... H01L 2224/48091; H01L 2224/73265; H01L 2224/15311; H01L 2225/06548; H01L 2924/15311; H01L 2224/48145
USPC ................. 257/774, 777, 278, 286, 678, 686; 438/765, 121
See application file for complete search history.

(56) References Cited

U.S. PATENT DOCUMENTS

| | | | |
|---|---|---|---|
| 5,032,896 A * | 7/1991 | Little et al. | 257/686 |
| 2005/0046002 A1* | 3/2005 | Lee et al. | 257/678 |
| 2008/0224322 A1* | 9/2008 | Shinogi | 257/777 |
| 2008/0265430 A1* | 10/2008 | Ishihara | 257/777 |
| 2009/0294990 A1* | 12/2009 | Ishino et al. | 257/777 |
| 2010/0285635 A1* | 11/2010 | Jo et al. | 438/109 |
| 2011/0147911 A1* | 6/2011 | Kohl et al. | 257/686 |

FOREIGN PATENT DOCUMENTS

| | | |
|---|---|---|
| JP | 2002-033442 | 1/2002 |
| JP | 2008-218505 | 9/2008 |
| JP | 2009-049118 | 3/2009 |
| JP | 2010-278334 | 12/2010 |

* cited by examiner

*Primary Examiner* — Long K Tran
*Assistant Examiner* — Dzung Tran
(74) *Attorney, Agent, or Firm* — Flynn, Thiel, Boutell & Tanis, P.C.

(57) ABSTRACT

A semiconductor device containing: a semiconductor element; a support substrate; an insulating material layer for sealing the semiconductor element and a periphery thereof; a metal thin film wiring layer provided in the insulating material layer, with a part thereof being exposed on an external surface; and metal vias provided in the insulating material layer and electrically connected to the metal thin film wiring layer. The semiconductor element is provided in a plurality of units and the respective semiconductor elements are stacked via an insulating material such that a circuit surface of each semiconductor element faces the metal thin film wiring layer, and electrode pads of each semiconductor element are exposed without being hidden by the semiconductor element stacked thereabove.

12 Claims, 13 Drawing Sheets

SEMICONDUCTOR DEVICE D

SEMICONDUCTOR DEVICE A

+

+

FIG. 3D (NOT SHOWN)

FIG. 3F (NOT SHOWN)

FIG. 3L (NOT SHOWN)

FIG. 3N (NOT SHOWN)

FIG. 3P REPEATING STEPS SHOWN IN FIG. 3H TO FIG. 3O TWICE

SEMICONDUCTOR DEVICE B

SEMICONDUCTOR DEVICE C

SEMICONDUCTOR DEVICE D

FIG. 7D    (NOT SHOWN)

FIG. 7F    (NOT SHOWN)

FIG. 7K (NOT SHOWN)

FIG. 7M (NOT SHOWN)

FIG. 7O    REPEATING STEPS SHOWN IN FIG. 7H TO FIG. 7N SIX TIMES

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. More specifically, the present invention relates to a multi chip package-type semiconductor device having a structure in which a plurality of semiconductor chips are stacked vertically, and to the manufacturing method thereof.

2. Description of the Related Art

Pursuant to the recent demands for higher functionality and lighter, thinner and smaller electronic equipment, high-density integration and even high-density mounting of electronic components have advanced, and the downsizing of semiconductor devices used in the foregoing electronic equipment is also advancing faster than ever before.

As a method of manufacturing a semiconductor device such as an LSI unit or an IC module, as shown in FIG. 10, there is a method of manufacturing a Stacked MCP (Multi Chip Package) which is obtained by foremost facing the circuit surfaces of a plurality of semiconductor elements 2 determined as being non-defective in electrical property testing, in the same direction and stacking such semiconductor elements 2 on a support substrate 43 in a manner where the electrode pads (not shown) of the respective semiconductor elements are exposed without being hidden by the other semiconductor elements, electrically connecting the electrode pads of the semiconductor elements and the support substrate 43 via a wire bonding 46, thereafter sealing the product with a sealing resin 55, forming solder balls 56 as external connecting terminals, and individually cutting the semiconductor elements to complete the semiconductor devices (for instance, refer to Japanese Patent Application Publication No. 2002-33442).

Nevertheless, with a conventional semiconductor device obtained as described above, since only one side or both sides of the semiconductor element can be electrically connected with the support substrate, since wire bonding is used for the connection, there is a limit in that only two semiconductor elements can be simultaneously operated.

Moreover, there are demands for thinning the package in which a plurality of semiconductor elements are stacked, and in order to meet such demands, it is necessary to reduce the thickness of each semiconductor element and mount such thin semiconductor elements, and reduce the height of the connecting members such as a wire bonding.

Nevertheless, the connection of the wire bonding to be connected to the semiconductor element needs to pass above the mounted semiconductor element, but if the height of the connecting member is low, it will connect with the semiconductor element and cause a short-circuit.

Thus, in order to prevent the portions other than the electrodes of the semiconductor element from contacting the wire bonding, as shown in FIG. 11, an insulating material layer 34 as a protective resin layer is formed on a part of the electrode-forming part or the side face or back face of the semiconductor element 2 in order to prevent short-circuits (for instance, refer to Japanese Patent Application Publication No. 2009-49118).

When simultaneously operating more than two semiconductor elements, it is necessary to stack the semiconductor elements so as to be directly connected with the two semiconductor elements to be operated for simultaneous operation with the two semiconductor elements. Thus, the size of the semiconductor device becomes large, and the junction temperatures in the semiconductor elements will increase due to the poor heat radiation of the stacked structure, thereby causing a problem in that the foregoing simultaneous operation is not possible.

As recent trends, the downsizing of the semiconductor package size and the increase in the number of semiconductor elements that can be mounted are being demanded. In order to meet these demands, the following have been proposed and developed; namely, a semiconductor device having a POP (Package on Package) structure in which another semiconductor package or a circuit board is stacked on a semiconductor package (Japanese Patent Application Publication No. 2008-218505) and a semiconductor device having a TSV (Through Silicon Via) structure (Japanese Patent Application Publication No. 2010-278334).

A conventional POP structure semiconductor device is now explained based on FIG. 8. POP (Package on Package) is a package mode in which a plurality of different LSIs are assembled as individual packages, tested, and then stacking the packages thereafter.

The semiconductor device 40 is configured by another semiconductor package 42 being stacked on a semiconductor package 41. A semiconductor element 44 is mounted on the substrate 43 of the lower semiconductor package 41, and electrode pads (not shown) formed at the periphery of the semiconductor element 44 and electrode pads 45 on the substrate are electrically connected via wires 46. The entire surface of the semiconductor element 44 is sealed with a sealing member 47. In addition, the semiconductor package 41 and the semiconductor package 42 are mutually electrically connected based on reflow via external connecting terminals 48 (solder balls) formed on the lower face of the semiconductor package 42.

POP is advantageous in that the mounting area can be increased upon mounting devices as a result of stacking a plurality of packages as described above, and, since each package can be individually tested, the production yield loss can be reduced. Nevertheless, with POP, since the individual packages are individually assembled and the completed packages are stacked, it is difficult to reduce the assembly costs based on the reduction (shrinkage) of the semiconductor element size, and there is a problem in that the assembly cost of the stacked module is extremely expensive.

A conventional TSV structure semiconductor device is now explained with reference to FIG. 9. As shown in FIG. 9, a semiconductor device 50 has a structure in which a plurality of semiconductor elements 51 mutually have the same function and structure and which are respectively prepared using the same manufacture mask and one interposer substrate 52 are stacked via a resin layer 53. Each semiconductor element 51 is a semiconductor element using a silicon substrate, and is electrically connected to the upper and lower adjacent semiconductor elements via multiple through electrodes (TSV: Through Silicon Via) 54 that penetrate the silicon substrate and sealed with sealing resin 55. Meanwhile, the interposer substrate 52 is a circuit board made of resin, and a plurality of external connecting terminals (solder balls) 56 are formed on the back face thereof.

With a conventional TSV (Through Silicon Via) stacked module structure, since through-holes are provided to each of the individual semiconductor elements, there is a possibility that the semiconductor element will become damaged, and it is also necessary to add several complex and costly wafer processes of forming via electrodes in the through-holes. Thus, this resulted in a considerable cost increase of the overall vertically stacked module. Moreover, with the conventional structure, it is difficult to stack and mount chips of different sizes and, due to the "addition of different rewiring layers for each layer", which is essential upon the lamination of the same chips as in a memory device, the manufacture costs increase considerably in comparison to ordinary memory device modules, and there is a problem in that the cost reduction based on mass production cannot be expected.

SUMMARY OF THE INVENTION

An object of this invention is to provide a semiconductor device and its manufacturing method which can achieve a smaller and thinner semiconductor device and considerably reduce the number of manufacturing steps by causing a plurality of semiconductor chips to be a vertically-stacked structure.

In order to achieve the foregoing object, the present inventors completed the present invention by discovering that the foregoing object can be achieved with the following configuration; namely, by adopting, as a unit structure component, a structure including a semiconductor element, an insulating material layer for sealing the semiconductor element and periphery thereof, a metal thin film wiring layer provided in the insulating material layer, with a part thereof being exposed on an external surface, and metal vias provided in the insulating material layer and which are electrically connected to the metal thin film wiring layer, wherein plural semiconductor elements are provided, respective semiconductor elements are stacked via an insulating material such that a circuit surface of each semiconductor element faces the metal thin film wiring layer electrode pads of each semiconductor element are exposed without being hidden by the semiconductor element stacked thereabove and electrically connected to the metal thin film wiring layer.

In other words, the present invention is as described below.
(1) A semiconductor device, comprising:
  a semiconductor element;
  a support substrate;
  an insulating material layer for sealing the semiconductor element and a periphery thereof;
  a metal thin film wiring layer provided in the insulating material layer, with a part thereof being exposed on an external surface; and
  metal vias provided in the insulating material layer and electrically connected to the metal thin film wiring layer, wherein
  a plurality of semiconductor elements are provided, and the respective semiconductor elements are stacked via an insulating material such that a circuit surface of each semiconductor element faces the metal thin film wiring layer, and
  electrode pads of each semiconductor element are exposed without being hidden by the semiconductor element stacked thereabove and electrically connected to the metal thin film wiring layer.
(2) A semiconductor device, comprising a plurality of unit structure components stacked on a support substrate, each unit structure component comprising:
  a semiconductor element;
  an insulating material layer for sealing the semiconductor element and a periphery thereof;
  a metal thin film wiring layer provided in the insulating material layer, with a part of this metal thin film wiring layer being exposed on an external surface; and
  metal vias provided in the insulating material layer and electrically connected to the metal thin film wiring layer, wherein
  a plurality of semiconductor elements are provided, and the respective semiconductor elements are stacked such that a circuit surface of each semiconductor element faces the metal thin film wiring layer, and
  electrode pads of each semiconductor element are exposed without being hidden by the semiconductor element stacked thereabove and electrically connected to the metal thin film wiring layer,
wherein the respective unit structure components are electrically connected by the metal vias.
(3) The semiconductor device according to (1) or (2) above, wherein the insulating material layer is formed of a plurality of insulating material layers made of respectively different insulating materials.
(4) The semiconductor device according to any one of (1) to (3) above, wherein the insulating material layer is formed of a photosensitive insulating resin layer and a non-photosensitive insulating resin layer.
(5) The semiconductor device according to any one of (1) to (4) above, wherein the support substrate is made of a metal material, and the support substrate is connected to a GND.
(6) The semiconductor device according to any one of (1) to (4) above, wherein the support substrate is made of an organic material or made of an organic material and a metal conductor.
(7) The semiconductor device according to (6) above, wherein other semiconductor package or electronic component is stacked via the support substrate, and the semiconductor device is electrically connected to the other semiconductor package or electronic component via through-holes provided to the support substrate.
(8) A method of manufacturing the semiconductor device according to (1) above, comprising the steps of:
  stacking and fixing, on a support substrate, a plurality of semiconductor elements such that circuit surfaces thereof face the same direction, and electrode pads of each semiconductor element are exposed without being hidden by the other semiconductor element;
  forming a first insulating material layer for sealing the semiconductor elements and peripheries thereof;
  forming, in the first insulating material layer, openings for forming metal vias and openings for electrically connecting the electrode pads;
  forming a metal thin film seed layer on the first insulating material layer surface;
  filling a conductive material in the openings and forming a metal thin film wiring layer at predetermined areas on the metal thin film seed layer;
  removing the metal thin film seed layer on the first insulating material layer surface except the areas where the metal thin film wiring layer is formed; and
  forming a second insulating material layer on the first insulating material layer provided thereon with the metal thin film wiring layer.
(9) A method of manufacturing the semiconductor device according to (2) above, comprising the steps of:
  stacking and fixing, on a support substrate, a plurality of semiconductor elements such that circuit surfaces thereof face the same direction, and electrode pads of each semiconductor element are exposed without being hidden by the other semiconductor elements;
  forming a first insulating material layer for sealing the semiconductor elements and peripheries thereof;
  forming, in the first insulating material layer, openings for forming metal vias and openings for electrically connecting the electrode pads;

forming a metal thin film seed layer on the first insulating material layer surface;

filling a conductive material in the openings and forming a metal thin film wiring layer at predetermined areas on the metal thin film seed layer;

removing the metal thin film seed layer on the first insulating material layer surface except the areas where the metal thin film wiring layer is formed; and forming a second insulating material layer on the first insulating material layer formed thereon with the metal thin film wiring layer, whereby a semiconductor element stacked body is manufactured as a unit structure component; and mounting a plurality of the unit structure components on the second insulating material layer by repeating the foregoing series of steps, wherein the respective unit structure components are electrically connected by the metal vias.

The semiconductor device of the present invention yields the following effects.

The number of wiring layer formation steps can be reduced in the manufacture process of a multi chip package. Electrical connection with the semiconductor elements stacked via the rewiring technology is enabled. Both a metal support substrate and an organic support substrate can be used as the support substrate.

DESCRIPTION OF THE PREFERRED EMBODIMENTS

Upon completing the present invention, the present inventors examined a semiconductor device to become a prototype of this invention and the manufacturing method thereof. Since the features of the present invention will become more evident by way of comparison with the prototype semiconductor device and the manufacturing method thereof, this prototype semiconductor device (hereinafter referred to as "Semiconductor Device D") is taken as a reference example hereinafter and foremost explained.

Figure 6:
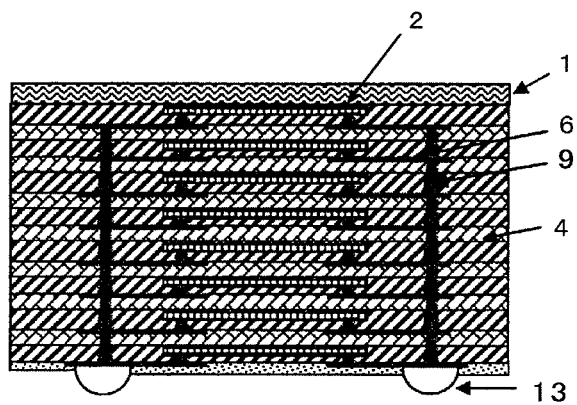
FIG. 6 is a cross-sectional view showing an example of the semiconductor device as a reference example.

FIG. 6 is a diagram showing the structure of Semiconductor Device D. This Semiconductor Device D is structured by stacking a plurality of unit structure components, wherein each unit structure component is configured from a semiconductor element 2, an insulating material layer 4 for sealing the semiconductor element 2 and its periphery, a metal thin film wiring layer 6 provided in the insulating material layer 4, and via 9 provided in the insulating material layer 4 and electrically connected to the metal thin film wiring layer 6, wherein the illustrated structure is configured by stacking eight semiconductor elements.

Figure 7A:
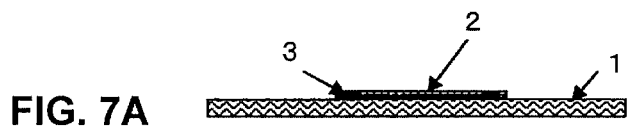
FIGS. 7A to 7S are a diagram showing the steps of the method of manufacturing the semiconductor device illustrated in FIG. 6.
Figure 7B:
Figure 7C:
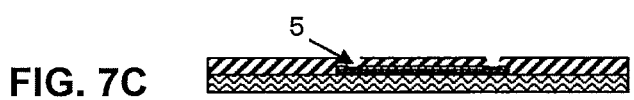
Figure 7E:
Figure 7G:
Figure 7H:
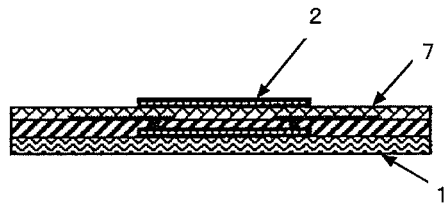
Figure 7I:
Figure 7J:
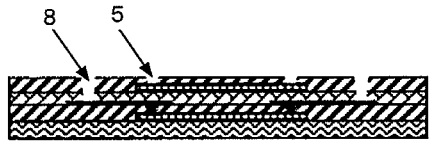
Figure 7L:
Figure 7N:
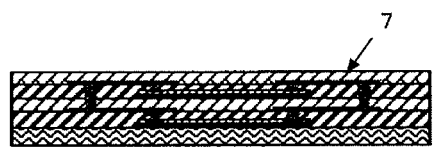
Figure 7P:
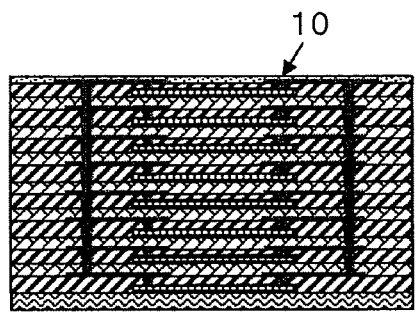
Figure 7Q:
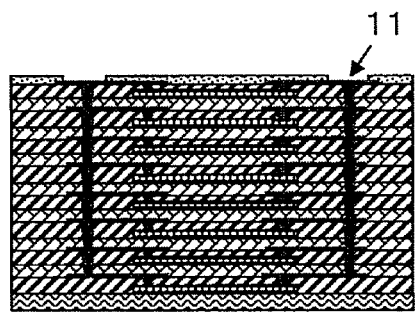
Figure 7R:
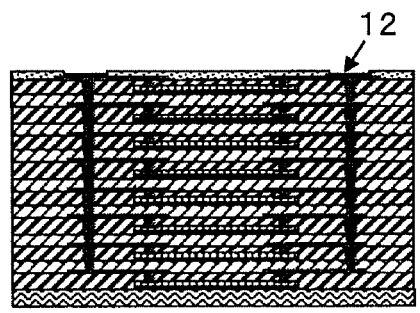
Figure 7S:
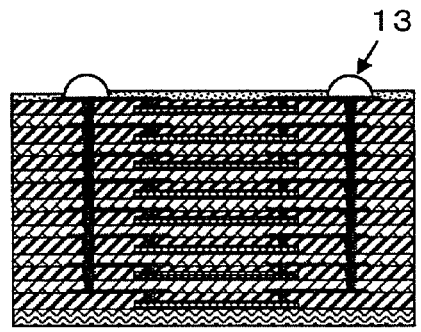
Figure 8:
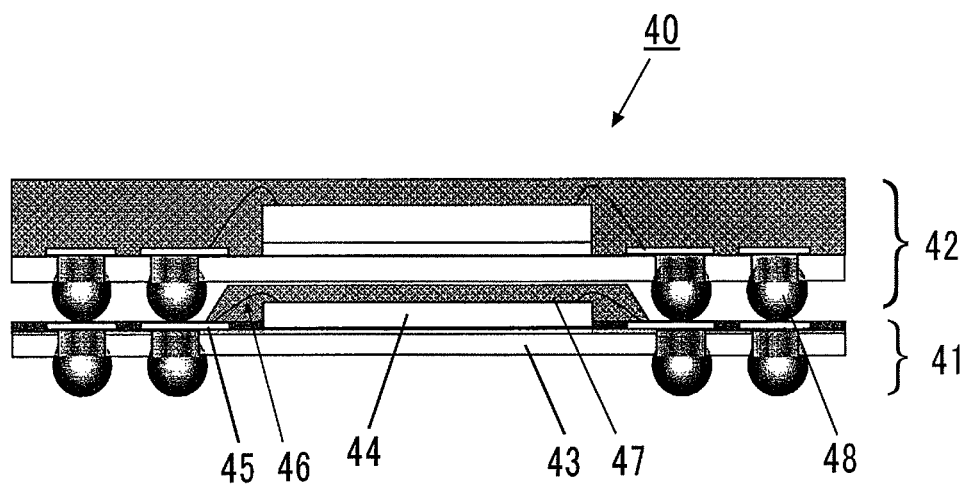
FIG. 8 is a diagram showing the structure of a conventional POP structure semiconductor device.
Figure 9:
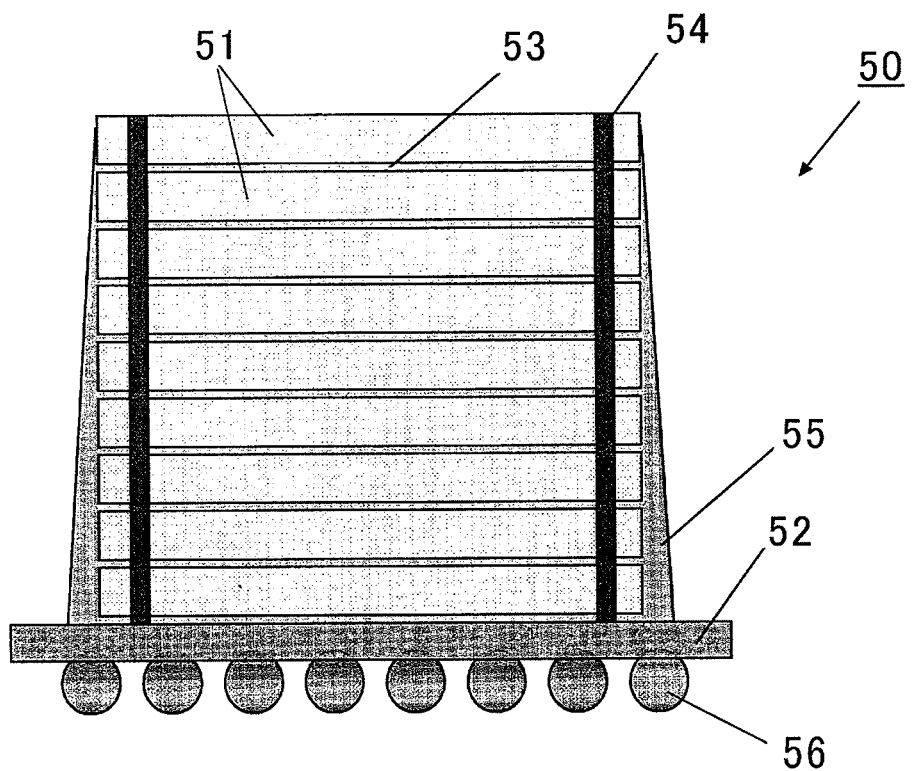
FIG. 9 is a diagram showing the structure of a conventional TSV structure semiconductor device.
Figure 10:
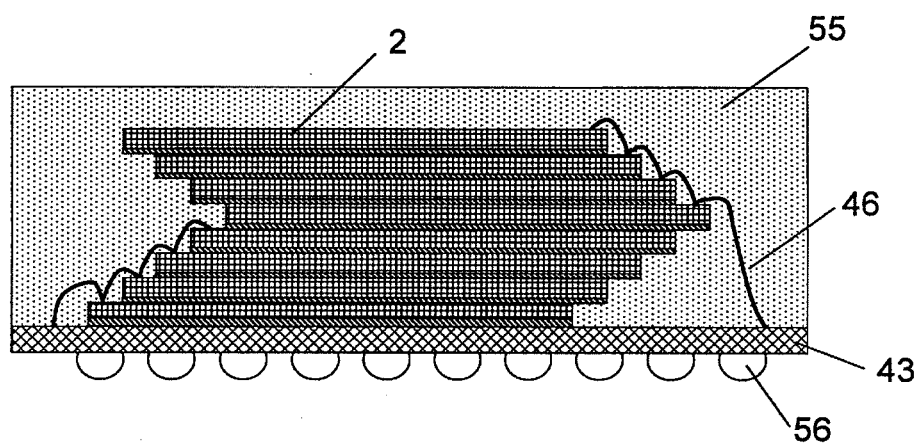
FIG. 10 is a diagram showing the structure of a semiconductor device as a conventional LSI unit or IC module.
Figure 11:
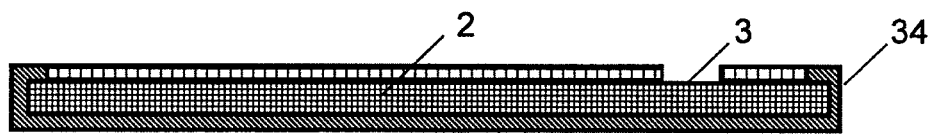
FIG. 11 is a diagram showing the structure for preventing short-circuits in a conventional semiconductor element.

The manufacturing method of this Semiconductor Device D is now explained with reference to FIGS. 7A to 7S. FIGS. 7A to 7S respectively illustrate steps (a) to (s) of the manufacturing method of Semiconductor Device D, and the respective steps are explained below.

(a) Step of Mounting Semiconductor Element on Support Substrate

A semiconductor element 2, which was determined as being non-defective in electrical property testing, is fixed on a support substrate 1, via an adhesive, with the circuit surface thereof facing up.

(b) Insulating Material Layer Forming Step

Insulating resin is supplied around the semiconductor element 2 fixed on the support substrate to form an insulating material layer 4 (insulating material layer a).

(c) Step of Forming Openings in Insulating Material Layer

Openings 5 are formed in the insulating material layer on the electrode pads 3 for causing the electrode pads of the semiconductor element 2 to be exposed from the insulating material layer 4.

(d) Metal Thin Film Seed Layer Forming Step (not Shown)

A metal thin film seed layer (underlayer) is formed on the entire upper surface of the insulating material layer 4 with the openings 5 by the vapor deposition method (sputtering), electroless plating or the like.

(e) Metal Thin Film Wiring Layer Forming Step

In order to form a metal thin film wiring layer onto the predetermined areas of the insulating material layer 4 with the seed layer formed thereon, a plating resist is formed and a conductive metal thin film wiring layer is formed on the areas, where the plating resist is removed via patterning, of the insulating material layer 4, by electrolytic plating. The openings 5 are filled with a conductive metal.

(f) Metal Thin Film Seed Layer Removal Step (not Shown)

After forming the metal thin film wiring layer 6, the plating resist at areas where the wiring layer is not formed and the seed layer (underlayer) below the plating resist are removed via etching.

(g) Insulating Material Layer Forming Step

An insulating material layer 7 (insulating material layer b) is formed on the surface of the insulating material layer 4 with the metal thin film wiring layer 6 formed thereon.

(h) Step of Mounting Semiconductor Element on Insulating Material layer

A semiconductor element 2, which was determined as being non-defective in electrical property testing, is fixed on the insulating material layer 7 (insulating material layer b), via an adhesive, with the circuit surface thereof facing up so as to mount the semiconductor element 2 on the insulating material layer 7.

(i) Insulating Material Layer Forming Step

Insulating resin is supplied around the semiconductor element 2 fixed on the insulating material layer 7 to form an insulating material layer 4 (insulating material layer a), and the semiconductor element 2 is thereby resin-sealed.

(j) Step of Forming Openings in Insulating Material Layer

Openings 8 for forming vias and openings 5 for exposing the electrode pads of the semiconductor element 2 are formed on the insulating material layer 4.

(k) Metal Thin Film Seed Layer Forming Step (not Shown)

A metal thin film seed layer (underlayer) is formed on the entire upper surface of the insulating material layer 4 with the openings 5 and the openings 8 formed thereon via a vapor deposition method (sputtering), electroless plating or the like.

(l) Metal Thin Film Wiring Layer Forming Step

In order to form a metal thin film wiring layer onto the predetermined areas of the insulating material layer 4 with the seed layer formed thereon, a plating resist is formed and the metal thin film wiring layer is formed on the areas, where the plating resist is removed via patterning, of the insulating material layer 4, by electrolytic plating. The openings 5 and 8 are filled with a conductive metal.

(m) Metal Thin Film Seed Layer Removal Step (not Shown)

After forming the metal thin film wiring layer 6, the plating resist at areas where the wiring layer is not formed and the seed layer (underlayer) below the plating resist are removed via etching.

(n) Insulating Material Layer Forming Step

An insulating material layer 7 (insulating material layer b) is formed on the surface of the insulating material layer 4 with the metal thin film wiring layer 6 formed thereon.

(o) Repeating Step

The steps of foregoing (h) to (n) are repeated six times. It is thereby possible to obtain the structure shown in FIG. 6 where eight semiconductor elements are stacked.

(p) Resist Layer Forming Step

In order to protect the wirings, a wiring protective film (resist layer) 10 such as a solder resist is formed on the surface of the metal thin film wiring layer. The solder resist is supplied with a roll coater when the solder resist is in a liquid form, and supplied by lamination or bonding press when the solder resist is of a film shape.

(q) Wiring Protective Film (Resist Layer) Opening Step

In order to electrically connect the semiconductor device with a semiconductor package or an electronic component, resist openings 11 for providing external metal electrodes to predetermined positions corresponding to the vias 9 are formed in the wiring protective film.

(r) Terminal Plating Step

A terminal plating 12 for providing external metal electrodes or an organic protective film is formed on the resist openings 11.

(s) External Metal Electrode Forming Step

External metal electrodes (solder balls 13 in the illustrated example) made of a conductive material are formed on the terminal plating. As the conductive material, conductive materials such as solder balls, conductive paste, solder paste and the like are used.

The semiconductor device (multi chip package) obtained as described above is divided into individual pieces, whereby the semiconductor devices are completed.

The foregoing manufacturing method has a problem in that one metal thin film wiring layer needs to be formed for each semiconductor element, and the number of steps thereby increases.

Thus, as a result of adopting a structure of electrically connecting a plurality of semiconductor elements to one metal thin film wiring layer, the present inventors enables the simplification of the manufacture step of the semiconductor device, and the downsizing of the semiconductor device.

This semiconductor device is now explained with reference to the embodiments.

Embodiment 1

Figure 1:
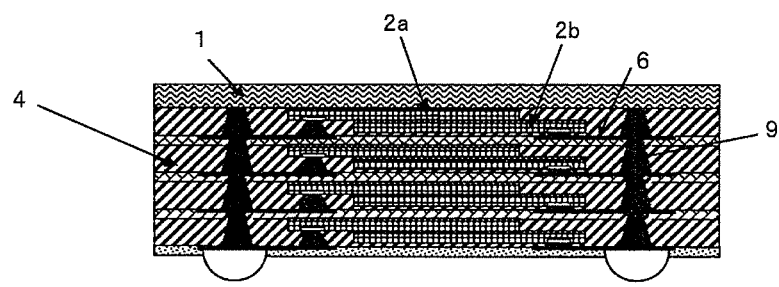
FIG. 1 is a diagram showing Embodiment 1 of the semiconductor device of the present invention.

FIG. 1 is a diagram showing the configuration of Semiconductor Device A of Embodiment 1 of the present invention.

As shown in the diagram, this Semiconductor Device A includes semiconductor elements 2a, 2b, an insulating material layer 4 for sealing the semiconductor elements 2a, 2b and their peripheries, a metal thin film wiring layer 6 provided in the insulating material layer 4 and in which a part thereof is exposed on the external surface, and metal vias 9 provided in the insulating material layer and electrically connected to the metal thin film wiring layer. Reference numeral 1 represents a metal support substrate.

In addition, the two semiconductor elements 2a, 2b are stacked and provided to the insulating material layer 4, and the structure is such that one metal thin film wiring layer 6 is provided to the two semiconductor elements.

The two semiconductor elements 2a, 2b are stacked via the insulating material with the circuit surfaces thereof facing the metal thin film wiring layer 6, and the electrode pads of the respective semiconductor elements 2a, 2b are exposed so that the pads of the lower semiconductor are not hidden by the semiconductor element stacked thereabove, and electrically connected to the metal thin film wiring layer.

Figure 2A:
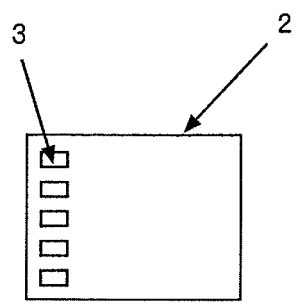
FIGS. 2A and 2B are diagrams each showing a stacking example upon stacking the semiconductor elements.
Figure 2A:
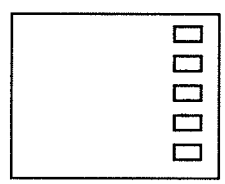
Figure 2A:
Figure 2A:
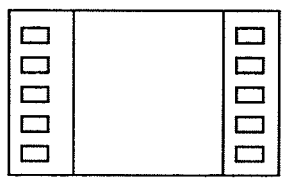
Figure 2B:
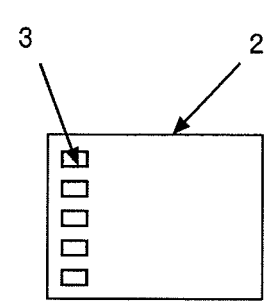
Figure 2B:
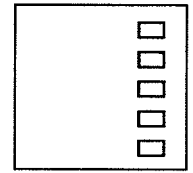
Figure 2B:
Figure 2B:
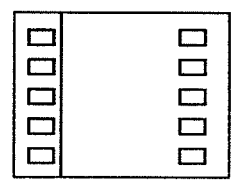

When the two semiconductor elements 2a, 2b are stacked, in order to enable the electrode pads of the lower semiconductor element to be exposed without being hidden by the upper semiconductor element, for instance, as shown in FIG. 2A, there is a method of opposing the direction of semiconductor chips of the same size and stacking the semiconductor elements so that the electrode pads of the lower semiconductor element are exposed, or, as shown in FIG. 2B, using semiconductor elements of different sizes and stacking the semiconductor elements so that the electrode pads of the lower semiconductor element is exposed.

Figure 3A:
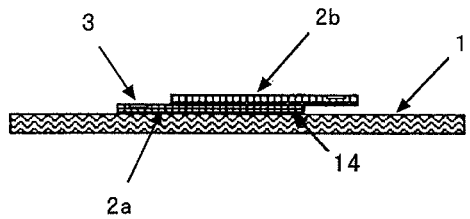
FIGS. 3A to 3T are a diagram showing the steps of the method of manufacturing the semiconductor device of Embodiment 1.
Figure 3B:
Figure 3C:
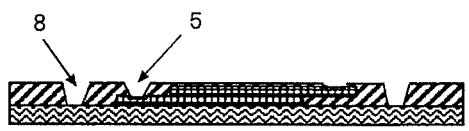
Figure 3E:
Figure 3G:
Figure 3H:
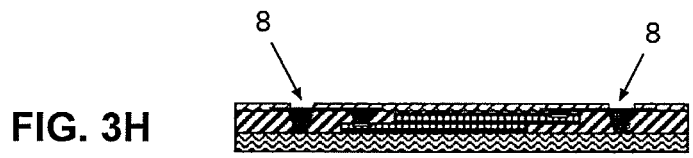
Figure 3I:
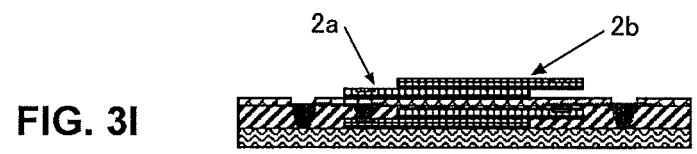
Figure 3J:
Figure 3K:
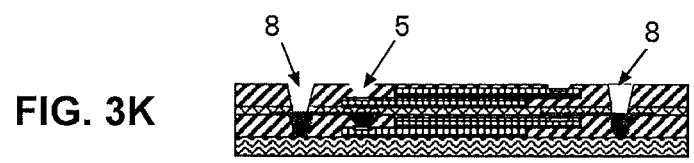
Figure 3M:
Figure 3O:
Figure 3Q:
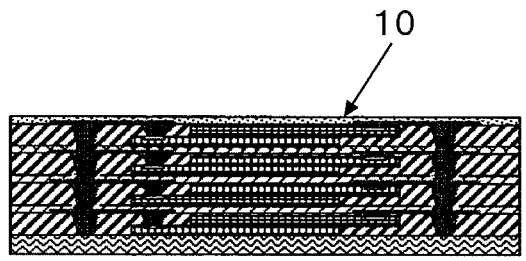
Figure 3R:
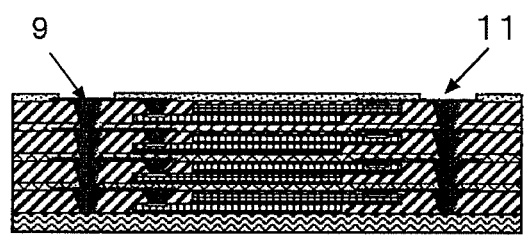
Figure 3S:
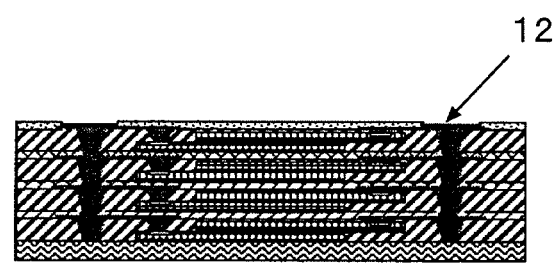
Figure 3T:
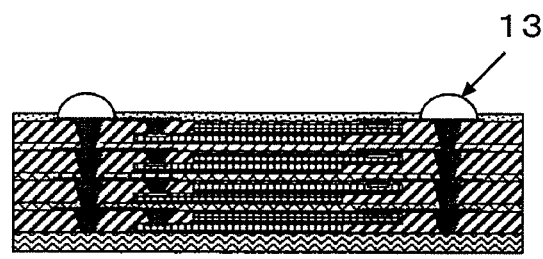

The manufacturing step of Semiconductor Device A of Embodiment 1 is now explained in detail with reference to FIGS. 3A to 3T which respectively illustrate steps (A) to (T) described below.

(A) Step of Mounting Semiconductor Element on Metal Support Substrate

A first semiconductor element 2a, determined as non-defective in electrical property testing, is fixed on a support substrate 1, via an adhesive, with the circuit surface thereof facing up. In addition, a second semiconductor element 2b is fixed on the first semiconductor element via an adhesive, with the circuit surface of the second semiconductor element facing up, so that the electrode pads of the first semiconductor element are exposed. Reference numeral 14 is a die attach.

(B) Insulating Material Layer Forming Step

Insulating resin is supplied around the semiconductor elements 2a and 2b fixed on the metal support substrate 1 to form an insulating material layer 4 (insulating material layer a). A thermosetting resin is used as the insulating resin, but a photosensitive resin may also be used.

A thermosetting resin may be used as the insulating material layer around the semiconductor elements, and a photosensitive resin layer may be used as the layer thereabove. Consequently, the enhancing effect of the sealing reliability for the semiconductor elements by the thermosetting resin layer and the enhancing effect of the patterning properties by the photosensitive resin layer can be expected.

(C) Step of Forming Openings in Insulating Material Layer

Openings 5 are formed in the insulating material layer on the electrode pads 3 for causing the electrode pads 3 of the semiconductor elements 2a and 2b to be exposed from the insulating material layer 4, and openings 8 for forming vias are also formed in the insulating material layer 4.

The openings 5, 8 can be formed via laser beam machining. Moreover, the openings 5, 8 can also be formed via a microhole drill or, when the insulating material layer is made of photosensitive resin, the openings 5, 8 can also be opened via exposure and development. Moreover, a plurality of processing means can be used in combination.

(D) Metal Thin Film Seed Layer Forming Step (not shown)

A thin metal film seed layer (underlayer) is formed on the entire upper surface of the insulating material layer 4 having the openings 5, 8 via a vapor deposition method (sputtering), electroless plating or the like.

(E) Via Filling and Metal Thin Film Wiring Layer Forming Step

In order to form a wiring layer on the upper face of the insulating material layer 4 with the seed layer formed thereon, a plating resist is formed and a conductive metal thin film wiring layer 6 is formed on the insulating material layer 4, via electrolytic plating, at areas where the plating resist is removed via patterning, and the openings 5, 8 are filled with the conductive metal. Vias 9 are formed by the openings 8 filled with the conductive material.

(F) Metal Thin Film Seed Layer Removal Step (not Shown)

After forming the metal thin film wiring layer 6, the plating resist at areas where the wiring layer is not formed and the seed layer (underlayer) below the resist are removed via etching.

(G) Insulating Material Layer Forming Step

An insulating material layer 7 (insulating material layer b) is formed on the surface of the insulating material layer 4 with the metal thin film wiring layer 6 formed thereon.

(H) Step of Forming Openings in Insulating Material Layer

Openings 8 are formed in the insulating material layer 7 positioned above the vias 9 for securing the electrical connection of the vias 9.

(I) Step of Mounting Semiconductor Elements on Insulating Material Layer

The semiconductor elements 2a and 2b are fixed on the insulating material layer 7 (insulating material layer b), via an adhesive, with the circuit surfaces thereof facing up so as to mount the semiconductor elements 2a and 2b on the insulating material layer (J) Insulating Material Layer Forming Step Insulating resin is supplied around the semiconductor elements 2a and 2b fixed on the insulating material layer 7 to form an insulating material layer 4 (insulating material layer a), and the semiconductor elements 2a and 2b are thereby resin-sealed. Details regarding the insulating resin are as described in the foregoing step of (B).

(K) Step of Forming Openings in Insulating Material Layer

For the insulating material layer 7, openings 8 for forming vias and openings 5 for exposing the electrode pads of the semiconductor elements 2a and 2b are formed in the insulating material layer 4. The processing method is as described in the foregoing step of (C).

(L) Metal Thin Film Seed Layer Forming Step (not Shown)

A seed layer (underlayer) is formed on the entire upper surface of the insulating material layer 4 with the openings 5 and the openings 8 formed therein via a vapor deposition method (sputtering), electroless plating or the like.

(M) Metal Thin Film Wiring Layer Forming Step

In order to form a wiring layer on the upper face of the insulating material layer 4 with the seed layer formed thereon, a plating resist is formed and a metal thin film wiring layer 6 is formed on the insulating material layer 4 at areas where the resist is removed via patterning by electrolytic plating. Moreover, the openings 8 are filled with the conductive metal, whereby the vias 9 are formed, and the openings 5 are filled with the conductive metal.

(N) Seed Layer Removal Step (not shown)

After forming the metal thin film wiring layer 6, the plating resist at the areas, where the wiring layer is not formed, and the seed layer (underlayer) under the resist at the areas are removed via etching.

(O) Insulating Material Layer Forming Step

An insulating material layer 7 (insulating material layer b) is formed on the surface of the insulating material layer 4 with the metal thin film wiring layer 6 formed thereon.

(P) Repeating Step

The steps of foregoing (H) to (O) are repeated twice. It is thereby possible to obtain the structure shown in FIG. 1 where eight semiconductor elements are stacked.

(Q) Wiring Protective Film (Resist Layer) Forming Step

In order to protect the wirings, a wiring protective film (resist layer) 10 such as a solder resist is formed on the surface of the metal thin film wiring layer. The solder resist is supplied with a roll coater when the solder resist is in a liquid form, and supplied via lamination or bonding press when the solder resist is of a film shape.

(R) Resist Layer Opening Step

In order to electrically connect the semiconductor device with a semiconductor package or an electronic component, resist openings 11 for providing external metal electrodes to predetermined positions corresponding to the vias 9 are formed.

(S) Terminal Plating Step

A terminal plating 12 for providing external metal electrodes or an organic protective film is formed on the resist openings 11.

(T) External Metal Electrode Forming Step

External metal electrodes 13 (solder balls 13 in the illustrated example) made of a conductive material are formed on the terminal plating. As the conductive material, conductive materials such as a solder ball, conductive paste, solder paste and the like are used.

Normally, a plurality of semiconductor devices are simultaneously formed in the vertical direction and horizontal direction on a large-area support substrate. In this case, after the external electrodes 13 are formed, the obtained multi chip package is cut into individual pieces, whereby the semiconductor devices are completed.

While the semiconductor A shown in FIG. 1 is structured by stacking eight semiconductor elements, as a result of repeating the steps (H) to (O) shown in FIGS. 3H to 3O, it is possible to manufacture a semiconductor device in which more than eight semiconductor elements are stacked. While in the above case of Semiconductor Device A, the semiconductor elements used in each stacked body as a unit structure component are all shown with the same reference numerals 2a, 2b, for the sake of simplicity, this does not always mean that the same semiconductors are used in all the unit structure components. The different semiconductor elements may be used in the respective unit structure components.

Embodiment 2

Figure 4:
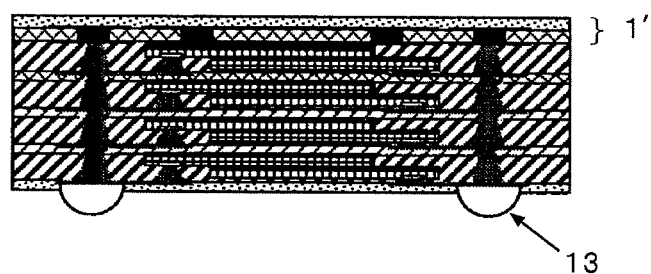
FIG. 4 is a diagram showing Embodiment 2 of the semiconductor device of the present invention.

Semiconductor Device B of Embodiment 2 uses an organic support substrate 1' in substitute for the metal support substrate 1 in the Semiconductor Device A of Embodiment 1 as shown in FIG. 4.

While the metal support substrate is advantageous in terms of heat-release properties and that it can be connected to GND, there are drawbacks in that the workability is inferior and hole-making is difficult, and it is difficult to provide insulation. Thus, it is difficult to mount another semiconductor package or electronic component on the metal support substrate.

Meanwhile, an organic support substrate made from an organic compound material such as glass-reinforced epoxy resin is advantageous, in comparison to a metal support substrate, in terms of favorable workability such as hole-making, and having insulating properties. Thus, as shown in FIG. 4, as a result of opening through-holes and providing electrical connection parts, it is possible to mount passive components such as a semiconductor package or capacitor on the semiconductor device.

Embodiment 3

Figure 5:
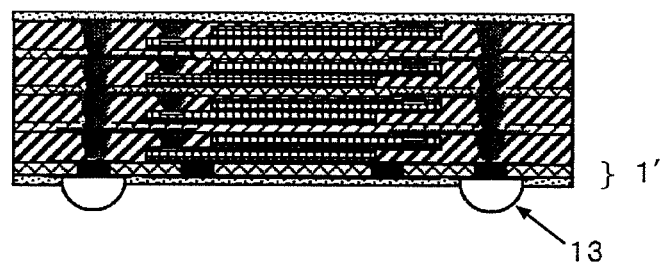
FIG. 5 is a diagram showing Embodiment 3 of the semiconductor device of the present invention.

With Semiconductor Device C of Embodiment 3, as shown in FIG. 5, the organic support substrate 1' used in Embodiment 2 is provided to the solder balls 13 mounting side.

This structure is able to achieve a face-up structure (semiconductor element circuit surfaces face the mounting face) as in the case of using wires for wiring, and it is easy to achieve the same terminal arrangement as in Embodiment 2.

Moreover, there is also an advantage in that the lower side is compatible with the motherboard since it is the organic support substrate.

What is claimed is:

1. A semiconductor device, comprising:
    a semiconductor element;
    a support substrate;
    an insulating material layer for sealing the semiconductor element and a periphery thereof;
    a sole metal thin film wiring layer provided in the insulating material layer, with a part thereof being exposed on an external surface; and
    metal vias provided in the insulating material layer and electrically connected to the sole metal thin film wiring layer, wherein
    the semiconductor element is provided in a plurality, and the respective semiconductor elements are stacked via an insulating material such that a circuit surface of each semiconductor element faces the sole metal thin film wiring layer, and
    electrode pads of each semiconductor element are electrically connected to the sole metal thin film wiring layer by a conductive metal filled in an opening formed in the insulating material layer on the electrode pads and directly extending to the sole metal thin film wiring layer for causing the electrode pads to be exposed to the sole metal thin film wiring layer without being hidden by the semiconductor element stacked thereabove, whereby said plurality of semiconductor elements are electrically connected to the sole metal thin film wiring layer.

2. A semiconductor device, comprising a plurality of unit structure components stacked on a support substrate, each unit structure component comprising:
    a semiconductor element;
    an insulating material layer for sealing the semiconductor element and a periphery thereof;
    a sole metal thin film wiring layer provided in the insulating material layer, with a part of this sole metal thin film wiring layer being exposed on an external surface; and
    metal vias provided in the insulating material layer and electrically connected to the sole metal thin film wiring layer, wherein
    the semiconductor element is provided in a plurality, and the respective semiconductor elements are stacked such that a circuit surface of each semiconductor element faces the sole metal thin film wiring layer, and
    electrode pads of each semiconductor element are electrically connected to the sole metal thin film wiring layer by a conductive metal filled in an opening formed in the insulating material layer on the electrode pads and directly extending to the sole metal thin film wiring layer for causing the electrode pads to be exposed to the sole metal thin film wiring layer without being hidden by the semiconductor element stacked thereabove, whereby said plurality of semiconductor elements are electrically connected to the sole metal thin film wiring layer,
    wherein the respective unit structure components are electrically connected by the metal vias.

3. The semiconductor device according to claim 1, wherein the insulating material layer is formed of a plurality of insulating material layers made of respectively different insulating materials.

4. The semiconductor device according to claim 2, wherein the insulating material layer is formed of a plurality of insulating material layers made of respectively different insulating materials.

5. The semiconductor device according to claim 1, wherein the insulating material layer is formed of a photosensitive insulating resin layer and a non-photosensitive insulating resin layer.

6. The semiconductor device according to claim 2, wherein the insulating material layer is formed of a photosensitive insulating resin layer and a non-photosensitive insulating resin layer.

7. The semiconductor device according to claim 1, wherein the support substrate is made of a metal material, and the support substrate is connected to a GND.

8. The semiconductor device according to claim 2, wherein the support substrate is made of a metal material, and the support substrate is connected to a GND.

9. The semiconductor device according to claim 1, wherein the support substrate is made of an organic material or made of an organic material and a metal conductor.

10. The semiconductor device according to claim 2, wherein the support substrate is made of an organic material or made of an organic material and a metal conductor.

11. The semiconductor device according to claim 9, wherein other semiconductor package or electronic component is stacked via the support substrate, and the semiconductor device is electrically connected to the other semiconductor package or electronic component via through-holes provided to the support substrate.

12. The semiconductor device according to claim 10, wherein other semiconductor package or electronic component is stacked via the support substrate, and the semiconductor device is electrically connected to the other semiconductor package or electronic component via through-holes provided to the support substrate.

* * * * *